(12) United States Patent
Murakuki

(10) Patent No.: US 6,801,447 B2
(45) Date of Patent: Oct. 5, 2004

(54) FERROELECTRIC STORAGE DEVICE

(75) Inventor: Yasuo Murakuki, Kyotanabe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/232,313

(22) Filed: Sep. 3, 2002

(65) Prior Publication Data

US 2003/0053326 A1 Mar. 20, 2003

(30) Foreign Application Priority Data

Sep. 4, 2001 (JP) ........................................ 2001-266587

(51) Int. Cl.$^7$ ............................................. G11C 11/22
(52) U.S. Cl. ...................................... 365/145; 365/203
(58) Field of Search .................................. 365/145, 203

(56) References Cited

U.S. PATENT DOCUMENTS 5,671,174 A * 9/1997 Koike et al. ................. 365/145
6,034,884 A    3/2000 Jung ........................... 365/145
6,510,071 B2 * 1/2003 Oowaki ....................... 365/145

FOREIGN PATENT DOCUMENTS

| JP | 9-97496   | 4/1997 |
| JP | 9-185890  | 7/1997 |
| JP | 11-238387 | 8/1999 |

* cited by examiner

*Primary Examiner*—Hoai Ho
(74) *Attorney, Agent, or Firm*—Parkhurst & Wendel, L.L.P.

(57) ABSTRACT

To provide a ferroelectric storage device which can read all the quantities of charge (polarization quantity: 2Pr) accumulated in a ferroelectric during a writing operation. In the present invention, a bit line is recharged, a charge quantity required for recharging is detected, and the quantity is read on a sub bit line, thereby achieving a stable reading operation.

4 Claims, 15 Drawing Sheets

FERROELECTRIC STORAGE DEVICE

FIELD OF THE INVENTION

The present invention relates to a nonvolatile memory and specifically concerns a reading operation of a semiconductor memory having a ferroelectric capacitor.

BACKGROUND OF THE INVENTION

In recent years, nonvolatile memories having a function of retaining data until power is turned off have been realized by using ferroelectric materials such as PZT, which demonstrates hysteresis characteristics. Such ferroelectric materials are used for a memory cell, so that nonvolatile memories are achieved with simple configurations.

Since FeRAM (Ferroelectric Random Access Memory) has nonvolatile characteristics and operates at high speed with low voltage, a number of manufacturers of memory chips have been interested in FeRAM. The operating speed of FeRAM is determined by polarization inversion time. The polarization inversion speed of a ferroelectric capacitor is determined by an area of the capacitor, a thickness of a ferroelectric thin film, applied voltage, and so on, and is normally expressed in nanosecounds [ns].

FIG. 15 shows a hysteresis loop of a ferroelectric capacitor.

A vertical axis indicates a quantity of charge induced on a surface of a ferroelectric by spontaneous polarization of the ferroelectric, that is, a polarization quantity [C]. A horizontal axis indicates voltage [V] applied to the ferroelectric capacitor.

When positive voltage is applied to the ferroelectric in a state in which the ferroelectric capacitor has an inter-terminal voltage of 0 [volt] and polarization does not occur, a polarization quantity increases from S0 to A of FIG. 15. The ferroelectric does not increase in polarization quantity at a certain voltage (electric field) or more. Namely, a polarization quantity reaches a maximum quantity at point A. The slope at this point is defined by the equation below.

$$Cs = dg/dV$$

where Cs represents a parallel plate capacitance component. Thereafter, even when an inter-terminal voltage of the ferroelectric capacitor is set at 0, a polarization quantity does not change to 0 but remains at S1. At this moment, a quantity of held polarization is expressed by Pr [C]. This characteristic is used to realize a nonvolatile memory.

FIG. 13 shows a ferroelectric memory including a typical memory cell of 1T1C (one transistor, one capacitor).

Reference character WL denotes a word line, reference characters BL and XBL denote bit lines, and reference characters BLS and XBLS denote sub bit lines.

Reference numeral 101 denotes a ferroelectric capacitor having one end connected to a cell plate line CP.

Reference numeral 103 denotes a reference capacitor having one end connected to a reference capacitor plate line RCP.

Reference numeral 102 denotes a ferroelectric capacitor selection transistor controlled by the word line WL.

Reference numeral 104 denotes a reference capacitor selection transistor controlled by a reference capacitor selection line RWL (hereinafter, referred to as a RWL line).

Reference numeral 112 denotes a sub bit line charge transistor serving as a sub bit charge circuit. The transistor is controlled by a pre-charge control signal PRE to pre-charge the sub bit lines BLS and XBLS to a level of power supply voltage Vdd.

Reference numeral 111 denotes a transfer gate serving as a bit line charge circuit. The transfer gate is constituted by transistors M1 and M2 for connecting the bit lines BL and XBL and the sub bit lines BLS and XBLS, and is controlled by an SSW line.

Reference numeral 113 denotes a sense amplifier which amplifies a potential difference between the bit lines BL and XBL and is controlled by a sense amplifier control signal SEN.

Reference numeral 110 denotes a transistor which discharges the bit lines BL and XBL to a ground potential and is controlled by a bit line discharge control signal BLDIS (hereinafter, referred to as a BLDIS line).

Reference numeral 120 denotes a bit line parasitic capacitance represented as parasitic capacities Cb of the bit lines BL and XBL.

Reference numeral 121 denotes a sub bit line parasitic capacitance represented as parasitic capacities Cbls of the sub bit lines BLS and XBLS.

Reference numeral 122 denotes a reading operation control section.

The reading operation control section 122 is configured so as to have a timing chart of FIG. 14.

Besides, in the present specification, an activating state will be represented as "H" level.

At time t0, the BLSDIS line is inactivated to cause the bit lines BL and XBL to enter a floating state.

At time t1, the SSW line is activated, and at time t2, the bit lines BL and XBL are pre-charged to the Vdd level. Further, the pre-charge control signal PRE is activated to stop the pre-charging of the bit lines BL and XBL.

At time t3, when the word lines WL and RWL are activated at a Vpp level (potential higher than Vdd) and a memory cell is selected, the voltage Vdd is applied to the ferroelectric capacitor 101 and the reference capacitor 103.

The following equations approximately indicate a potential Vbl (H) of the bit line when the ferroelectric capacitor 101 stores "H" data, and a potential Vbl (L) of the bit line when the ferroelectric capacitor 101 stores "L" data, respectively.

$$Vbl(H) = Vdd - \{Vdd/(Cb/Cs+1)\}$$

$$Vbl(L) = Vdd - \{Vdd/(Cb/Cs+1) + (2Pr/Cs)/(Cb/Cs+1)\}$$

Moreover, the reference capacitor 103 is set such that the reference bit line XBLS has a potential Vxbl expressed by the equation below.

$$Vxbl = Vdd - \{Vvp/(Cb/Cs+1) + (2Pr/Cs)/(Cb/Cs+1)\}/2$$

Thus, BL=BLS and XBL=XBLS have a potential difference Vdif.

$$Vdif = Vxb1 - Vb1 \qquad (1)$$
$$= Pr/Cs/(Cb/Cs+1)$$

Subsequently, at time t4, the sense amplifier control signal SEN is activated to start the sense amplifier 113, amplifying a bit line potential difference (|BL−XBL|).

Next, at time t5, the cell plate line CP is activated to rewrite "L" data in the ferroelectric capacitor 101. At time t6, the cell plate line CP is inactivated so as to inactivate the sense amplifier control signal SEN. At time t7, the BLDIS line is activated to discharge the bit lines BL and XBL. After the bit lines BL and XBL are discharged to VSS, the word line WL is inactivated at time t8, and the pre-charge control signal PRE is inactivated at time t9 to pre-charge the sub bit lines BLS and XBLS. The reading cycle is completed thus.

DISCLOSURE OF THE INVENTION

Equation (1) demonstrates the characteristic of a reading potential which increases as the parasitic capacitance Cb decreases. However, in reality, the bit line brought into a floating state is reduced in potential and sufficient voltage is not applied to the ferroelectric capacitor 101 due to its quantity of polarization charge, so that it is not possible to read all the quantities of charge (polarization charge quantity: 2Pr) accumulated in a ferroelectric.

Further, when the polarization charge quantity 2Pr is increased by providing a larger area of the ferroelectric capacitor 101 and a smaller thickness of the ferroelectric, the parasitic capacitance Cs also increases. Similarly as the above description, voltage applied to the ferroelectric capacitor 101 decreases, voltage (electric field) applied to the ferroelectric is reduced, so that a quantity of polarization charge during writing cannot be retrieved from the memory cell. It is needless to say that lower voltage applied to the ferroelectric during a low-voltage operation is a more serious problem.

The present invention has an object to provide a ferroelectric storage device which can fundamentally solve the above-described problems and perform a reading operation with stability.

The ferroelectric storage device of the present invention comprises reading means for detecting and reading a quantity of charge applied for charging a bit line in bit line charging circuits for charging the bit line connected to a selection transistor, the transistor being connected to a ferroelectric capacitor constituting a ferroelectric memory cell. According to this configuration, it is possible to perform the reading operation with stability as compared with prior art.

A ferroelectric storage device of the present invention including a ferroelectric memory cell constituted by a selection transistor and a ferroelectric capacitor, the selection transistor having the drain or source connected to one terminal of the ferroelectric capacitor, a word line connected to the gate of the selection transistor, a bit line connected to a drain or source of the selection transistor, the drain or source not being connected to the ferroelectric capacitor, a cell plate line connected to the other terminal of the ferroelectric capacitor, and bit line charge circuits for charging the bit line, characterized by comprising reading means for performing reading by detecting a quantity of charge applied for charging the bit line in the bit line charge circuit after the word line is activated.

According to this configuration, it is possible to recharge a bit line potential, which is reduced by a reading charge quantity of a ferroelectric during the reading operation. Namely, it is possible to apply voltage not depending upon a reading charge quantity to the ferroelectric capacitor and it is possible to apply the same voltage (electric field) as during the writing operation to the ferroelectric capacitor thus to read all the quantities of charge 2Pr stored in the ferroelectric, thereby improving a reading margin.

In the ferroelectric storage device of the present invention, the reading means may include sub bit lines (BLS, XBLS) connected to the bit line charge circuit so as to supply charge for charging the bit line, a sub bit line charge circuit for pre-charging the sub bit lines (BLS, XBLS) to a first potential (Vp1), and a sense amplifier for amplifying voltage of the sub bit lines.

In the ferroelectric storage device of the present invention, the following configuration is also preferable: the reading means activates the sub bit line charge circuit, pre-charges the sub bit lines to the first potential (Vp1) by activating the bit line charge circuit, pre-charges the bit lines to a second potential (Vp2), inactivates the sub bit line charge circuit, activates the word line, selects a memory cell for reading, activates the sense amplifier to amplify voltage of the sub bit lines, and performs the reading operation.

In the ferroelectric storage device of the present invention, the following configuration is also preferable: the reading means includes a second bit line charge circuit, and the reading means activates the sub bit line charge circuit, pre-charges the sub bit lines to the first potential and pre-charges the bit lines to the second potential (Vp2) by activating the second bit line charge circuit, inactivates the sub bit line charge circuit and the second bit line charge circuit, activates the bit line charge circuit, activates the word line, selects a memory cell for reading, activates the sense amplifier to amplify voltage of the sub bit lines, and performs the reading operation.

According to this configuration, the second bit line charge circuit is additionally provided, so that current consumption of the first potential (boosting potential) can be reduced, thereby achieving lower current consumption.

In the ferroelectric storage device of the present invention, the following configuration is also preferable: the reading means includes the second bit line charge circuit, and the reading means pre-charges a potential of the sub bit lines to the first potential (Vp1) in advance, pre-charges the bit line to the second potential (Vp2) by activating the second bit line charge circuit, inactivates the sub bit line charge circuit and the second bit line charge circuit, activates the bit-line charge circuit, activates the word line, selects a memory cell for reading, activates the sense amplifier to amplify voltage of the sub bit lines, and performs the reading operation.

According to this configuration, in a stand-by state, the sub bit lines are pre-charged to the first potential in advance, so that it is possible to shorten the pre-charging time of the sub bit lines during the reading operation, thereby increasing the speed. Further, current for charging and discharging the sub bit lines can be reduced, thereby achieving lower current consumption.

In the ferroelectric storage device of the present invention, the following configuration is also preferable: the reading means pre-charges the sub bit lines to a fourth potential (Vp4) by activating the sub bit line charge circuit, inactivates the sub bit line charge circuit, activates the word line and a cell plate, selects a memory cell for reading, activates the sense amplifier to amplify voltage of the sub bit lines, and performs the reading operation.

In the ferroelectric storage device of the present invention, the bit line charge circuit of the reading means may be a MOS transistor having the source connected to the sub bit line, the drain connected to the bit line, and the gate connected to the third potential (Vp3).

In the ferroelectric storage device of the present invention, the following configuration is also preferable: the bit line charge circuit of the reading means is an NMOS transistor having the source connected to the sub bit line, the drain connected to the bit line, and the gate connected to the third potential (Vp3), and the first potential (Vp1) and the third potential (Vp3) are equal to the activated potential of a word line selecting signal. According to this configuration, it is not necessary to provide another power supply circuit, resulting in a smaller chip.

In the ferroelectric storage device of the present invention, the following configuration is also preferable: the bit line charge circuit is a PMOS transistor having the source connected to the sub bit line, the drain connected to the bit line, and the gate connected to the third potential (Vp3), the second potential (Vp2) is lower than a ground potential (Vss), and the fourth potential (Vp4) is lower than the ground potential (Vss). According to this configuration, the necessity for pre-charging the bit lines is eliminated, thereby achieving lower current consumption at high speed.

In the ferroelectric storage device of the present invention, the bit line charge circuit of the reading means may be a clamping circuit having a bit line potential (SSW) as input.

In the ferroelectric storage device of the present invention, the following configuration is also preferable: the bit line charge circuit of the reading means is a clamping circuit having a bit line potential (SSW) as input, and the first potential (Vp1) is equal to the activating potential of the word line selecting signal.

In the ferroelectric storage device of the present invention, the following configuration is also preferable: the bit line charge circuit of the reading means is a clamping circuit having a bit line potential (SSW) as input, and the first potential (Vp1) is lower than the ground potential (Vss).

In the ferroelectric storage device of the present invention, the reading means may include a sub bit line load capacity on the sub bit lines (BLS, XBLS).

According to this configuration, it is possible to optimize a reading voltage applied to the sub bit lines, thereby stabilizing a reading potential.

In the ferroelectric storage device of the present invention, the reading means may be configured such that the sub bit line load capacity is a parasitic bit line capacity of an adjacent memory cell array. According to this configuration, it is not necessary to configure another capacity element, thereby reducing the area.

In the ferroelectric storage device of the present invention, the reading means may include a ferroelectric deterioration detecting circuit which has a plurality of the sub bit line load capacities, detects deterioration of the ferroelectric, and controls a capacity connected to the sub bit line (BLS). According to this configuration, a capacity added to the sub bit line is controlled, thereby further stabilizing a reading potential.

In the ferroelectric storage device of the present invention, the reading means may be selectively configured such that the sub bit line load capacities connected to a selection sub bit line (BLS) and a reference sub bit line (XBLS) are different. According to this configuration, it is possible to provide input of the sense amplifier with an offset and to perform screening of a memory cell having a small margin during inspection, thereby improving reliability.

A reading method of the ferroelectric storage device of the present invention in which the ferroelectric memory cell is formed by the selection transistor and the ferroelectric capacitor, the bit line (BL) is connected to the ferroelectric capacitor via the selection transistor, the sub bit line (BLS) is connected to the bit line (BL) via a transfer gate, the sub bit line (BLS) being pre-charged by the sub bit line charge transistor, and state of the ferroelectric capacitor is read from the sub bit line (BLS) by the sense amplifier, is characterized by comrising the steps of discharging the bit line (BL) and the sub bit line (BLS) to the ground potential (Vss), pre-charging the sub bit line (BLS) to the first potential (Vp1) level via the sub bit line charge transistor; pre-charging the bit line (BL) to the second potential (Vp2) level via the transfer gate, turning on the selection transistor to select the ferroelectric capacitor to carry out charging from the sub bit line (BLS) to the bit line (BL), and reading a quantity of change in reduced potential of the sub bit line (BLS) via the sense amplifier by the charging operation.

A reading method of the ferroelectric storage device according to another aspect of the present invention in which the ferroelectric memory cell is formed by the selection transistor and the ferroelectric capacitor, the bit line (BL) is connected to the ferroelectric capacitor via the selection transistor, the sub bit line (XBLS) is connected to the bit line (BL) via a transfer gate, the sub bit line (XBLS) being pre-charged by the sub bit line charge transistor, and the state of the ferroelectric capacitor is read from the sub bit line (XBLS) by the sense amplifier, is characterized by comprising the steps of discharging the bit line (BL) and the sub bit line (BLS) to the ground potential (Vss), pre-charging the sub bit line (BLS) to the first potential (Vp1) level via the sub bit line charge transistor, pre-charging the bit line (BL) to the second potential (Vp2) level via the bit line charge transistor, turning on the selection transistor to select the ferroelectric capacitor to carry out charging from the sub bit line (BLS) to the bit line (BL), and reading a quantity of change in reduced potential of the sub bit line. (BLS) via the sense amplifier by the charging operation.

A reading method of the ferroelectric storage device according to another aspect of the present invention in which the ferroelectric memory cell is formed by the selection transistor and the ferroelectric capacitor, the bit line (BL) is connected to the ferroelectric capacitor via the selection transistor, the sub bit line (XBLS) is connected to the bit line (BL) via the transfer gate, the sub bit line (XBLS) being pre-charged by the sub bit line charge transistor, and the state of the ferroelectric capacitor is read from the sub bit line (XBLS) by the sense amplifier, is characterized by comprising the steps of discharging the bit line (BL) and the sub bit line (BLS) to the ground potential (Vss), pre-charging the sub bit line (BLS) to the fourth potential (Vp4) via the sub bit line charge transistor, turning on the selection transistor to select the ferroelectric capacitor to carry out charging from the sub bit line (BLS) to the bit line (BL), and reading a quantity of change in reduced potential of the sub bit line (BLS) via the sense amplifier by the charging operation.

DESCRIPTION OF EMBODIMENTS

Referring to FIGS. 1 to 12, the following will discuss embodiments of the present invention.

Embodiment 1

Figure 1:
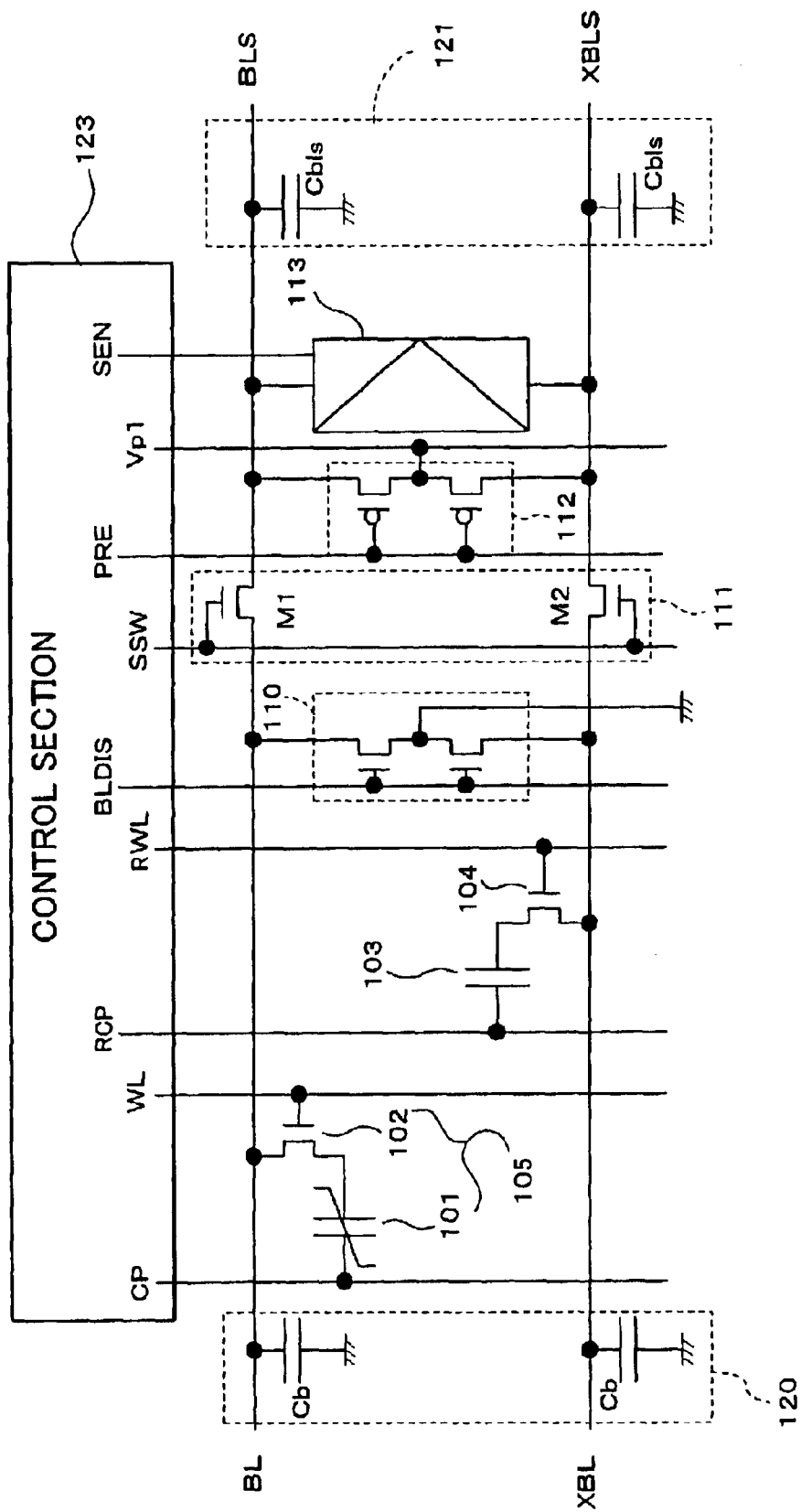
FIG. 1 is a structural diagram showing a ferroelectric storage device according to (Embodiment 1) of the present invention.
Figure 2:
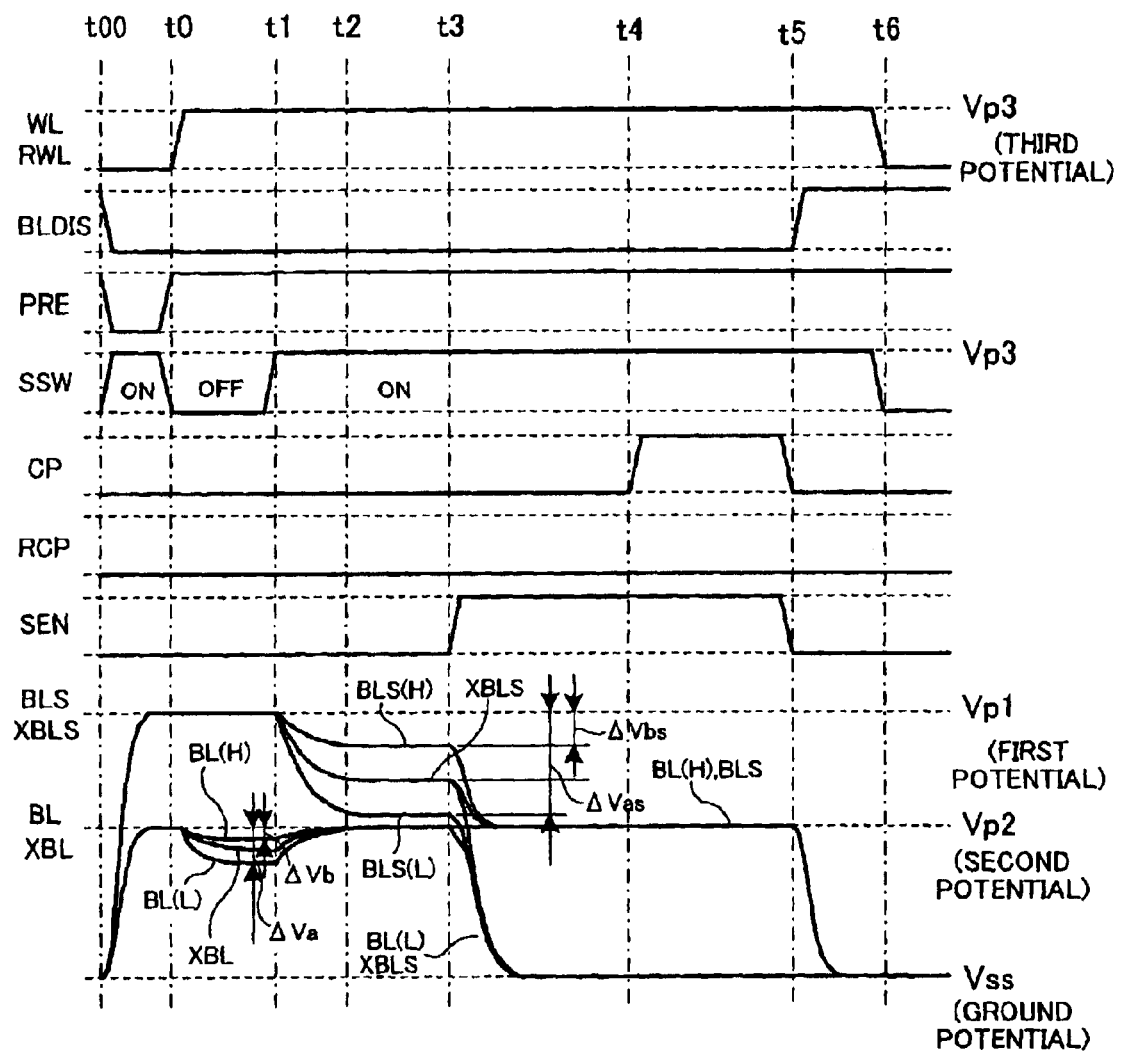
FIG. 2 is a reading timing chart of (Embodiment 1)
Figure 3:
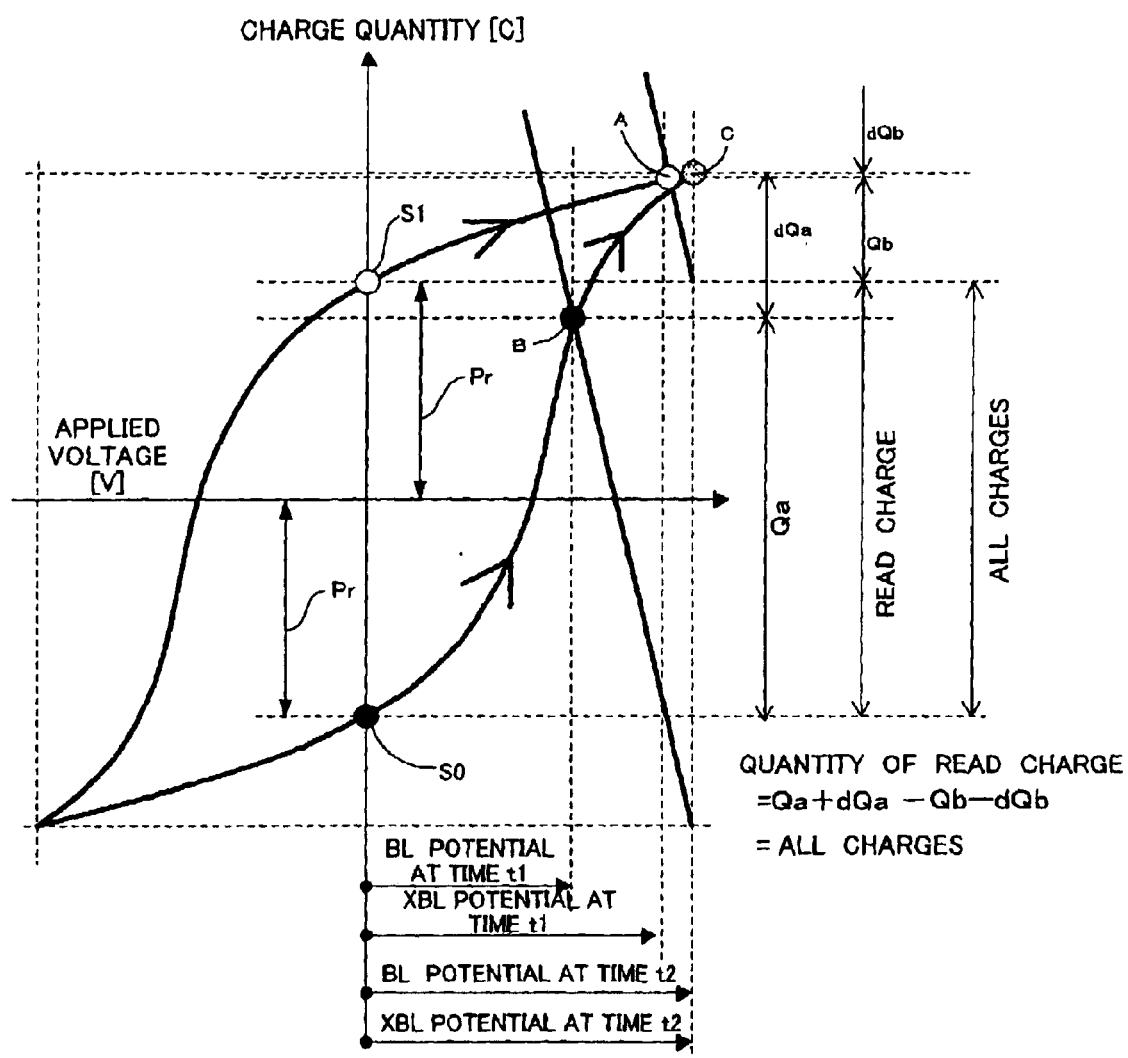
FIG. 3 is a hysteresis locus chart of (Embodiment 1)

FIGS. 1 to 3 show (Embodiment 1) of the present invention.

FIG. 1 shows a ferroelectric storage device according to (Embodiment 1) of the present invention. Those members having the same operations as those of FIG. 13, which illustrates the conventional example, are indicated by the same reference numerals in the explanation below.

Figure 13:
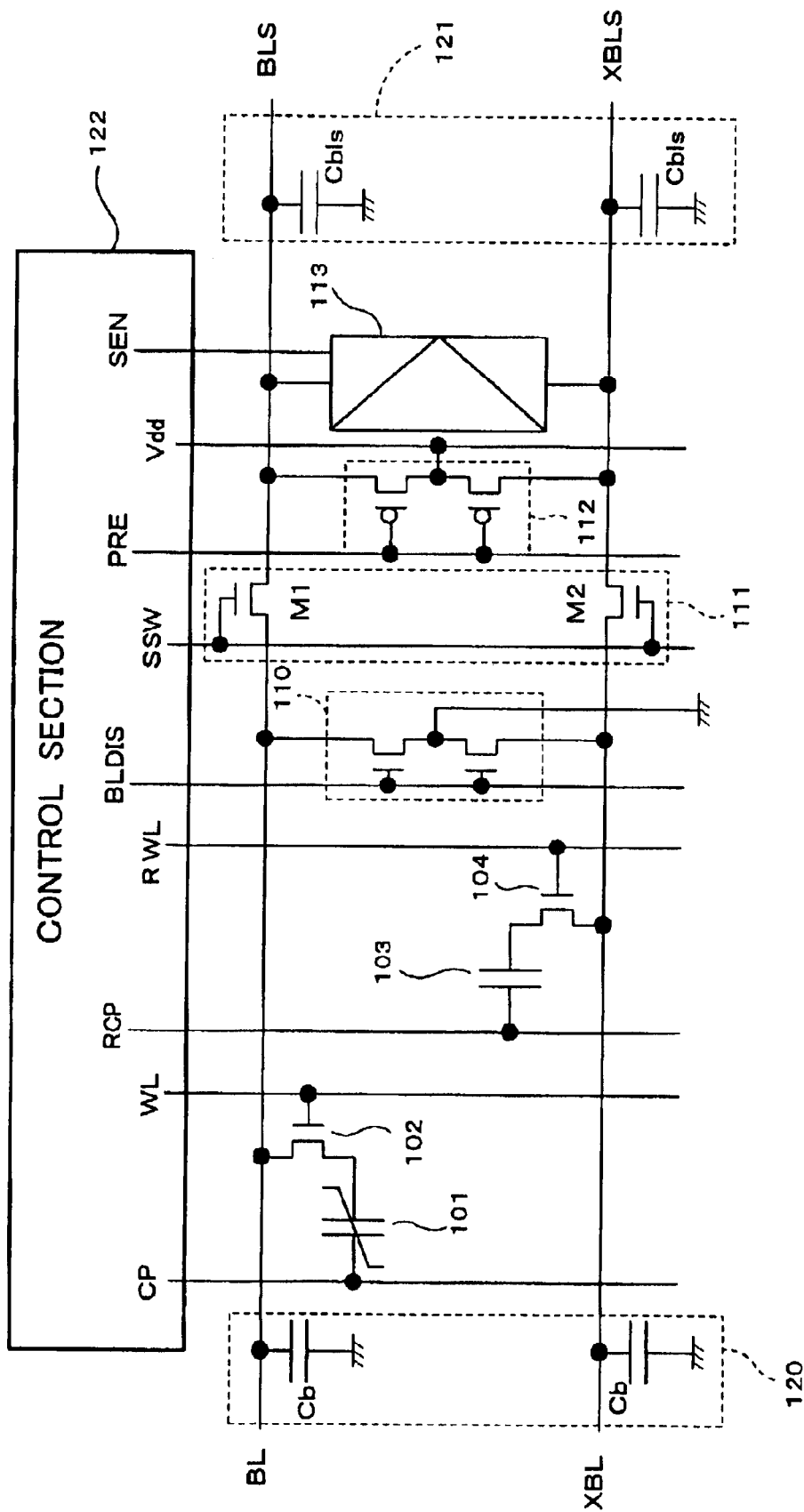
FIG. 13 is a structural diagram showing a ferroelectric storage device including a conventional 1T1C-type memory cell.
Figure 14:
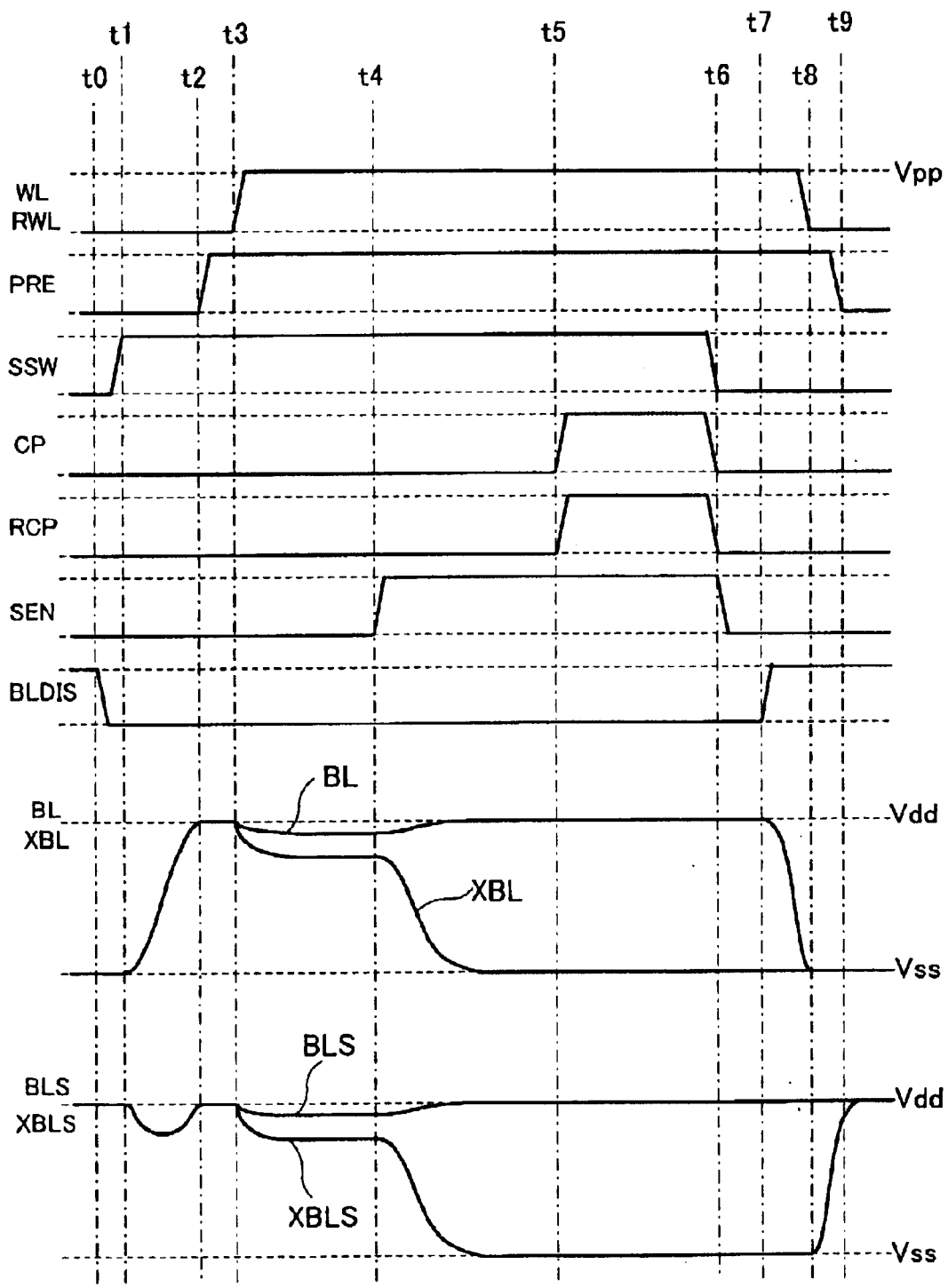
FIG. 14 is a timing chart showing a reading operation of the conventional example.
Figure 15:
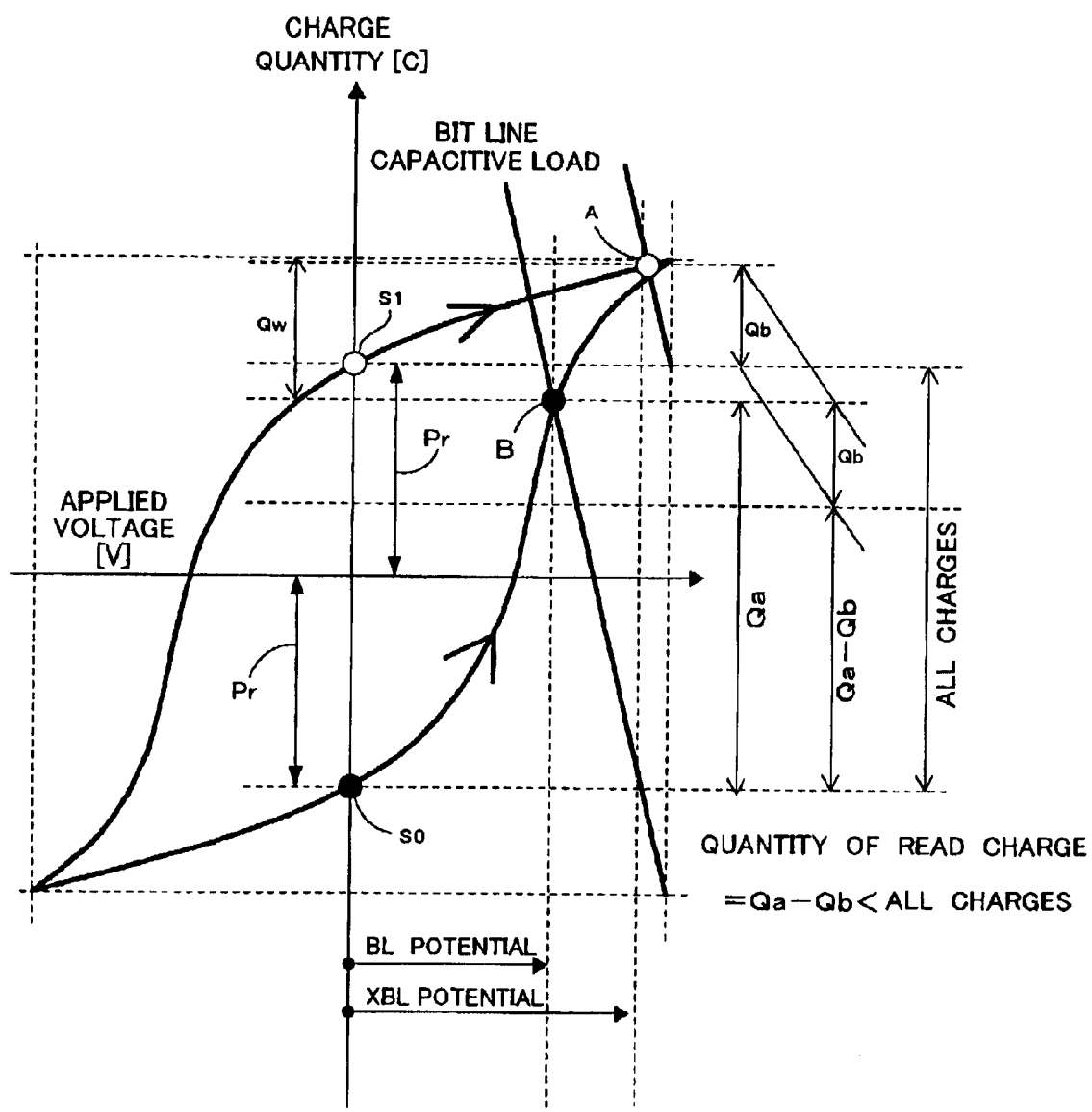
FIG. 15 is a hysteresis characteristic diagram showing a ferroelectric capacitor of the conventional example.

In (Embodiment 1), the configuration of a control section 123 is different from the control section 122 of FIG. 13 illustrating the conventional example. The control section 123 of FIG. 1 is configured so as to control the device according to a timing chart of FIG. 2.

Further, a ferroelectric memory cell 105 is formed by a selection transistor 102 and a ferroelectric capacitor 101. A sub bit line charge transistor 112 is a P-type transistor as that of FIG. 13. In (Embodiment 1), the sub bit line charge transistor 112 is controlled by a pre-charge control signal PRE so as to pre-charge a sub bit line (selection sub bit line) BLS and a sub bit line (reference sub bit line) XBLS to a first potential (Vp1) level.

Bit line charging means for charging the bit line BL is constituted by a transfer gate (bit line charge circuit) 111 and a sub bit line charge transistor 112.

The control section 123 is configured to control the device as follows:

At time t00, the bit lines BL and XBL and the sub bit lines BLS and XBLS are discharged to a ground potential Vss. At time t00, when a BLDIS line makes a transition to "L", the pre-charge control signal PRE makes a transition to "L", and an SSW line makes a transition to a third potential (Vp3), the sub bit lines BLS and XBLS are pre-charged to the first potential (Vp1) via the transistor 112, and the bit lines BL and XBL are pre-charged to a second potential (Vp2) via the transfer gate 111.

Besides, the condition that Vp1>Vp2 and Vp2+$V_T$=Vp3 is established, where $V_T$ represents a threshold voltage of the transistor. Vp1 is obtained by boosting power supply voltage Vdd by using a booster circuit.

At time t0, when a ferroelectric capacitor is selected while the pre-charge control signal PRE is set at "H" level, the SSW line is set at "L" level, and the word line WL is set at the third potential (Vp3), as shown in FIG. 3, the bit lines BL and XBL decrease by ΔVa and ΔVb according to charge quantities Qa and Qb stored in a memory cell.

At time t1, the SSW line is set at the third potential (Vp3). Now, transistors M1 and M2 have increased gate-to-source voltages by ΔVa and ΔVb as compared with the time of pre-charging the bit lines. Thus, charging from the sub bit lines BLS and XBLS to the bit lines BL and XBL is started.

At this moment, hysteresis is positioned on A and B of FIG. 3 and moves to C in response to the charging. Charges dQa and dQb of FIG. 3 are read by the charging operation, thereby reading all the charges.

Quantities of charge are expressed by (Qa+dQa) and (Qb+dQb), and charging is performed from a BLS pair (sub bit lines BLS and XBLS). The BLS pair is reduced in potential by the charging operation. The quantities of change are expressed by the equations below.

$$\Delta Vas = (Qa+dQa)/Cbls$$

$$\Delta Vbs = (Qb+dQb)/Cbls$$

A reading potential difference is expressed by the equation below.

$$\Delta V = (\Delta Vas - \Delta Vbs)/2$$
$$= (Qa - Qb + dQa - dQb)/(2 \times Cbls)$$

In this case, in order to perform the charging operation, it is necessary to set the second and third potentials (Vp2 and Vp3) such that the transistor M1 or M2, connected to a reference bit line, performs a saturating operation from time t1 to time t2.

A conventional reading potential difference is expressed by the equation below.

$$\Delta Vo = (Qa-Qb)/(2 \times Cb)$$

Thus, the reading potential difference can be improved from the conventional difference according to the equation below.

$$\eta = \Delta V / \Delta Vo$$
$$= Cb/Cbs\{1 + (dQa - dQb)/(Qa - Qb)\}$$

Consequently, the reading operation can be stabilized.

At time t3, a reading potential difference ΔV between the sub bit line BLS and the sub bit line XBLS is amplified by starting a sense amplifier 113. At time t4, a cell plate line CP is set at "H" to rewrite "L" data via the selection transistor 102.

At time t5, the bit lines are discharged while the cell plate line CP, a sense amplifier control signal SEN, and the SSW line are set at "L" and the BLDIS line is set at "H", and at time t6, the word lines WL and RWL are set at "L". The reading operation is thus completed.

(Embodiment 1) has a reading sequence in which after the bit lines are pre-charged, the SSW line is set at "L" level once at time t0, a ferroelectric capacity is selected while the word line WL is set at the third potential (Vp3), and then, the SSW line is set at the third potential (Vp3) again at time t1. It is possible to simultaneously make the transition of the word line WL to the third potential (Vp3) and the transition of the SSW line to the third potential (Vp3), and it is not necessary to make the transition of the SSW line once to "L" level, thereby increasing the speed.

Embodiment 2

Figure 4:
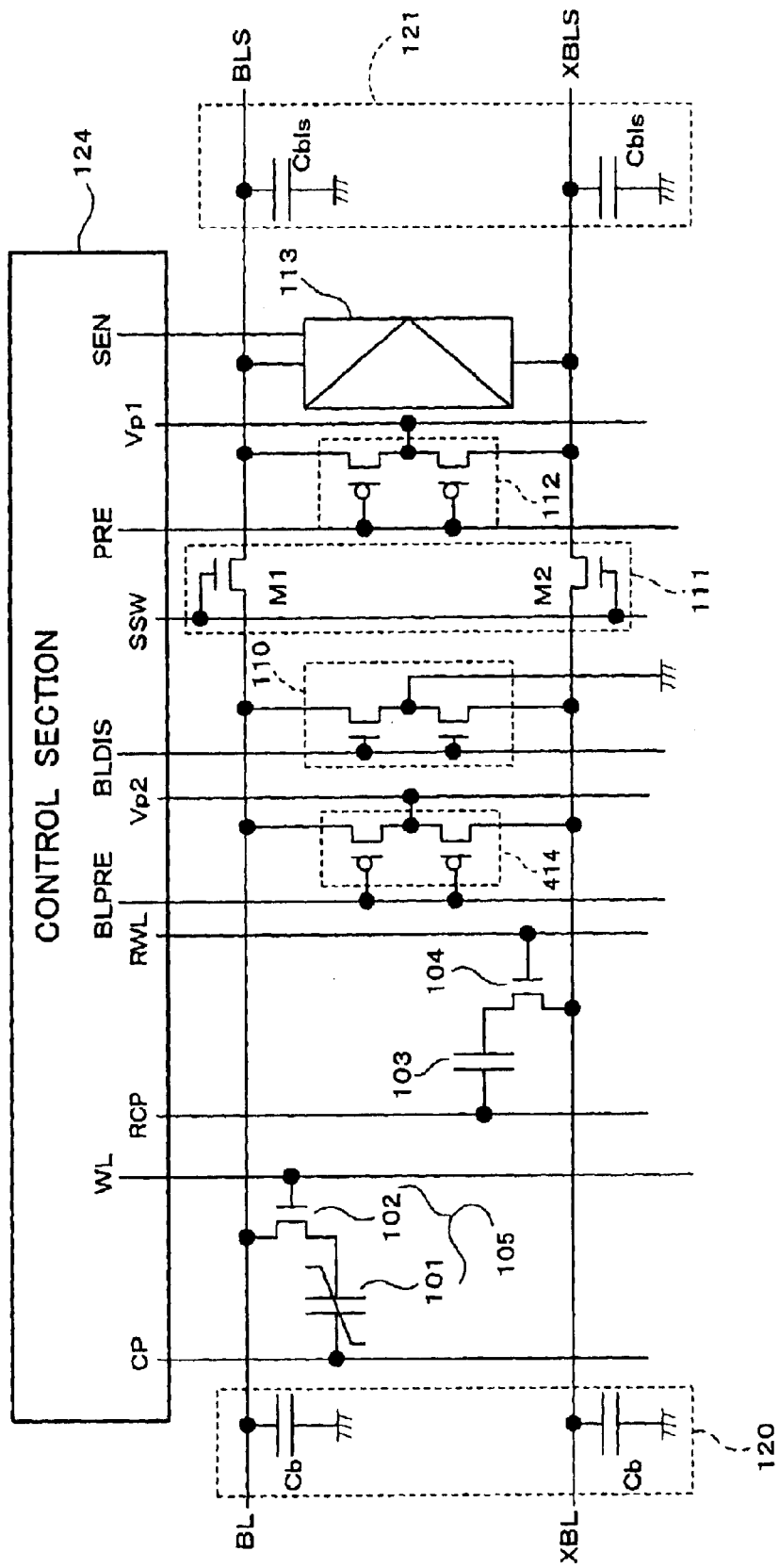
FIG. 4 is a structural diagram showing a ferroelectric storage device according to (Embodiment 2) of the present invention.
Figure 5:
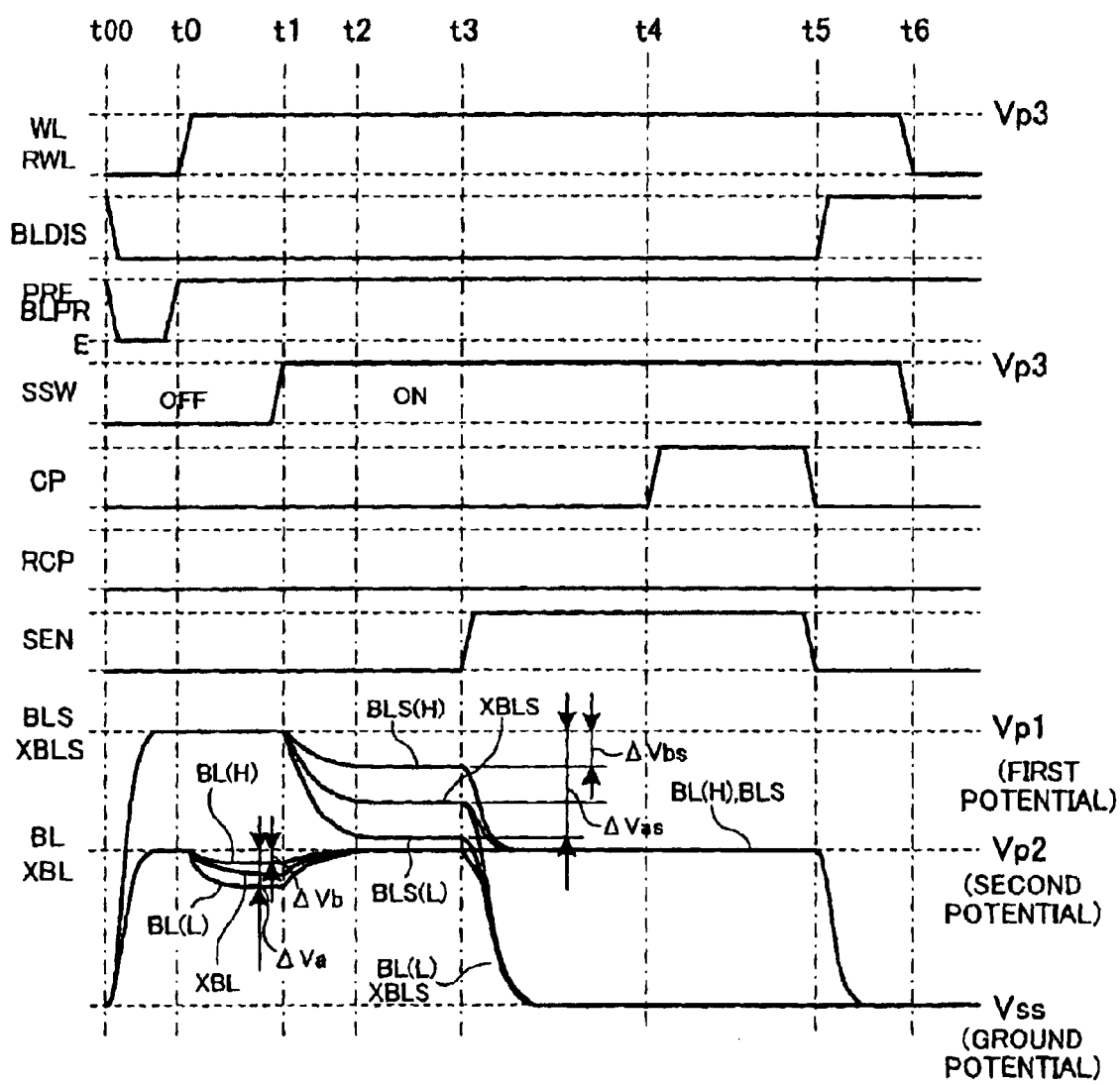
FIG. 5 is a reading timing chart of (Embodiment 2)

FIGS. 4 and 5 show (Embodiment 2) of the present invention.

FIG. 4 shows a ferroelectric storage device according to (Embodiment 2) of the present invention. Those members having the same operations as those of (Embodiment 1) are indicated by the same reference numerals in the explanation below.

In (Embodiment 2), a bit line charge transistor 414 is added which is composed of a P-type transistor serving as a second bit line charge circuit, and the configuration of a control section 124 is different. The bit line charge transistor 414 for charging bit lines BL and XBL to a second potential (Vp2) is controlled by a pre-charge control signal BLPRE.

The control section 124 of FIG. 4 is configured so as to control the device according to a timing chart of FIG. 5.

At time t00, the bit lines BL and XBL and sub bit lines BLS and XBLS are discharged to a ground potential Vss. From time t00, a BLDIS line is set at "L" and pre-charge control signals PRE and BLPRE are set at "L". The sub bit lines BLS and XBLS are pre-charged to a first potential (Vp1) and the bit lines BL and XBL are pre-charged to the second potential (Vp2).

Besides, the condition that Vp1>Vp2 and Vp2+$V_T$=Vp3 is established, where $V_T$ denotes a threshold voltage of a transistor.

At time t0, a ferroelectric capacitor is selected while the pre-charge control signals PRE and BLPRE are set at "H" level and the word line WL is set at a third potential (Vp3). The subsequent operations are similar to those of (Embodiment 1).

In ordinary cases, the first potential (Vp1) is power supply boosted by a boosting power supply and so on. Vp1 can be supplied from an external power supply, so that power consumption can be reduced by loss of power conversion.

Further, in (Embodiment 2) as well, it is possible to simultaneously make a transition of a word line WL to the third potential (Vp3) level and a transition of an SSW line to the third potential (Vp3), thereby increasing the speed.

Furthermore, the following configuration is also applicable: the sub bit line is pre-charged to the first potential (Vp1) in advance, the bit line is pre-charged to the second potential (Vp2) by activating the bit line charge transistor 414, the sub bit line charge circuit and the second bit line charge circuit are inactivated, the word line is activated after the bit line charge circuit is activated, a sense amplifier is activated to amplify voltage of the sub bit line after a memory cell for reading is selected, and the reading operation is performed.

Embodiment 3

Figure 6:
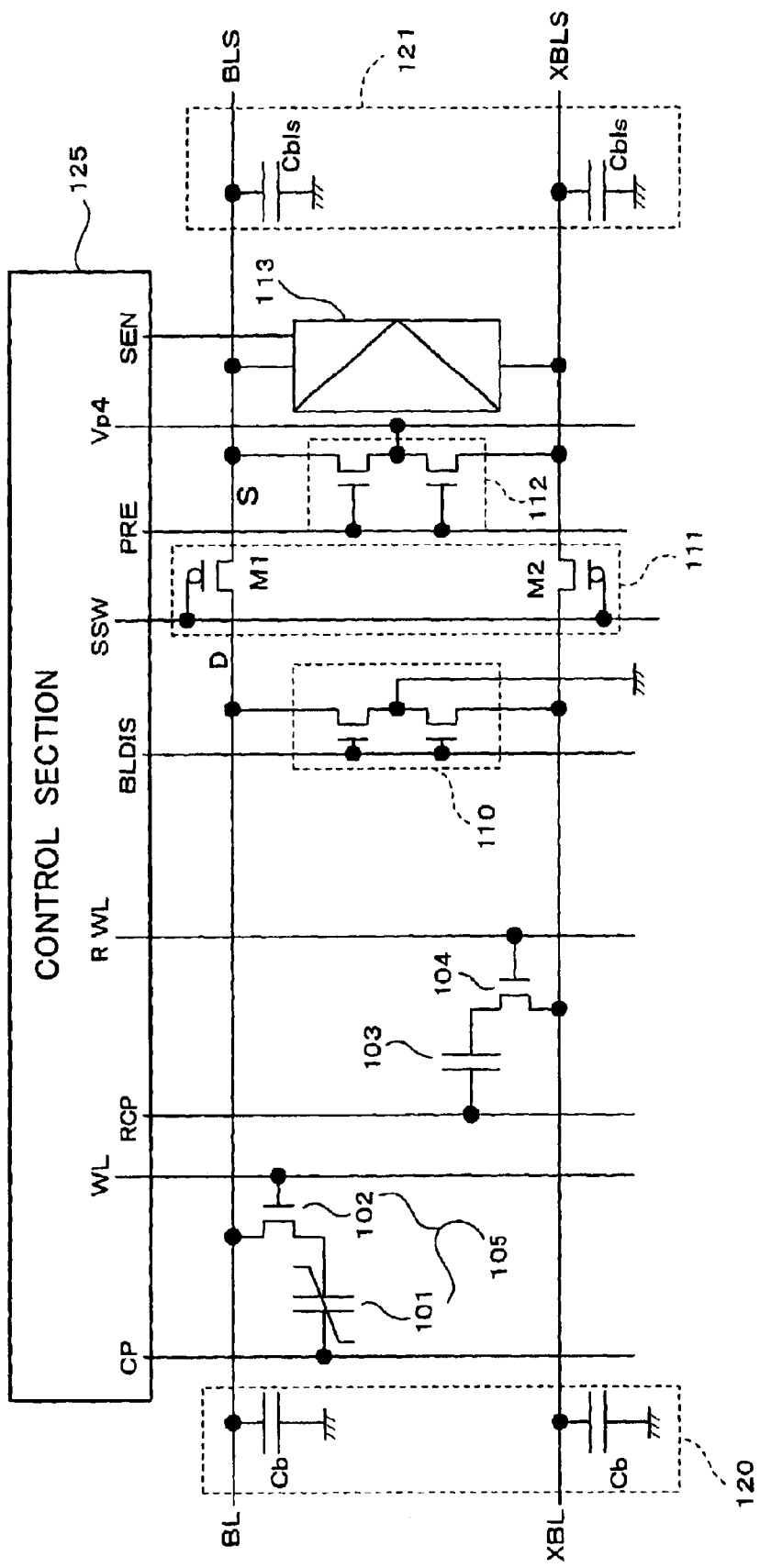
FIG. 6 is a structural diagram showing a ferroelectric storage device according to (Embodiment 3) of the present invention.
Figure 7:
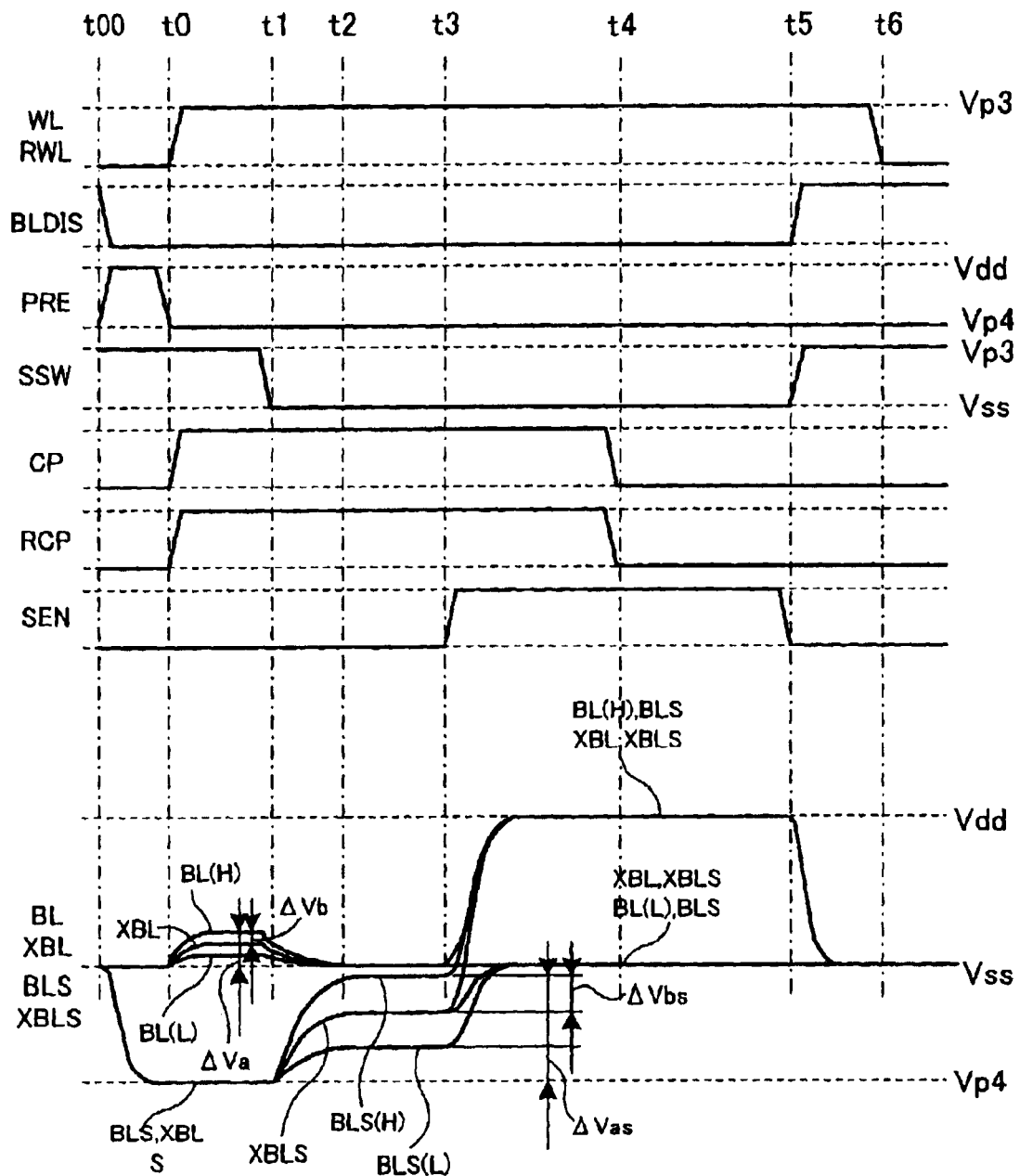
FIG. 7 is a reading timing chart of (Embodiment 3)

FIGS. 6 and 7 show (Embodiment 3) of the present invention.

FIG. 6 shows a ferroelectric storage device according to (Embodiment 3) of the present invention. Those members having the same operations as those of (Embodiment 1) are indicated by the same reference numerals in the explanation below.

(Embodiment 3) is different from (Embodiment 1) in that a transfer gate 111 is constituted by P-type transistors and a transfer gate 112 is constituted by N-type transistors. Besides, the configuration of a control section 125 is different from that of (Embodiment 1).

The transistor 112 is controlled by a pre-charge control signal PRE to charge sub bit lines BLS and XBLS to a fourth potential (Vp4) level.

The control section 125 of FIG. 6 is configured so as to control the device according to a timing chart of FIG. 7.

At time t00, the bit lines BL and XBL and sub bit lines BLS and XBLS are discharged to a ground potential Vss.

From time t00, a BLDIS line is set at "L", the pre-charge control signal PRE is set at "H", and the sub bit lines BLS and XBLS are pre-charged to a fourth potential (Vp4) via the transistor 112.

At time t0, a ferroelectric capacitor is selected while the pre-charge control signal PRE is set at the fourth potential (Vp4), a word line WL is set at a third potential (Vp3) level, and cell plate lines CP and RCP are set at "H". When the ferroelectric capacitor is selected, the bit lines BL and XBL increase by ΔVa and ΔVb according to charge quantities Qa and Qb (FIG. 3) stored in a memory cell.

At time t1, when an SSW line is set at a Vss level, transistors M1 and M2 increase in Vgs by Va and ΔVb as compared with the pre-charging of the bit lines. Thus, charging from the sub bit lines BLS and XBLS to the bit lines BL and XBL is started.

At this moment, hysteresis positioned on A and B (FIG. 3) moves to C in response to the charging. Charges dQa and dQb (FIG. 3) are further read by the charging operation, thereby reading all the charges.

Charge quantities used for this charging are expressed by (Qa+dQa) and (Qb+dQb), and the charging is started from a BLS pair. This charging operation reduces a potential of the BLS pair.

The quantities of change are expressed by the equations below.

$$\Delta Vas = (Qa+dQa)/Cbls$$

$$\Delta Vbs = (Qb+dQb)/Cbls$$

A reading potential difference is expressed by the equation below.

$$\Delta V = (\Delta Vas - \Delta Vbs)/2$$
$$= (Qa - Qb + dQa - dQb)/(2 X Cbls)$$

A conventional reading potential difference is expressed by the equation below.

$$\Delta VQ = (Qa-Qb)/(2XCb)$$

Comparing the reading potential difference and the conventional potential difference, it is found that the former difference can be improved as expressed by the equation below.

$$\eta = \Delta V / \Delta Vo$$
$$= Cb/Cbls\{1 + (dQa - dQb)/(Qa - Qb)\}$$

Thus, the reading operation can be stabilized. At time t3, a reading potential difference ΔV appearing on the sub bit lines is amplified by starting a sense amplifier while a sense amplifier control signal SEN is set at "H".

After time t3, the bit lines BL and BLS are charged to a power supply voltage Vdd.

At time t4, "H" data is rewritten while cell plate lines CP and RCP are set at "L". At time t5, the bit lines are discharged while the sense amplifier control signal SEN is set at "L", the SSW line is set at Vss, and a BLDIS line is set at "H", and word lines WL and RWL are set at "L". The reading operation is completed thus.

In this configuration, since pre-charging of the bit lines is not necessary, the power consumption can be reduced by a charge quantity of Cb1*Vp1 as compared with (Embodiment 1). Further, time for pre-charging the bit lines with large capacities is not necessary, thereby increasing the speed.

Besides, the following configuration is also applicable: a bit-line charge circuit (111) is a clamping circuit having a bit line potential (SSW) as input, and a first potential (Vp1) is set lower than a ground potential (Vss).

Embodiment 4

Figure 8:
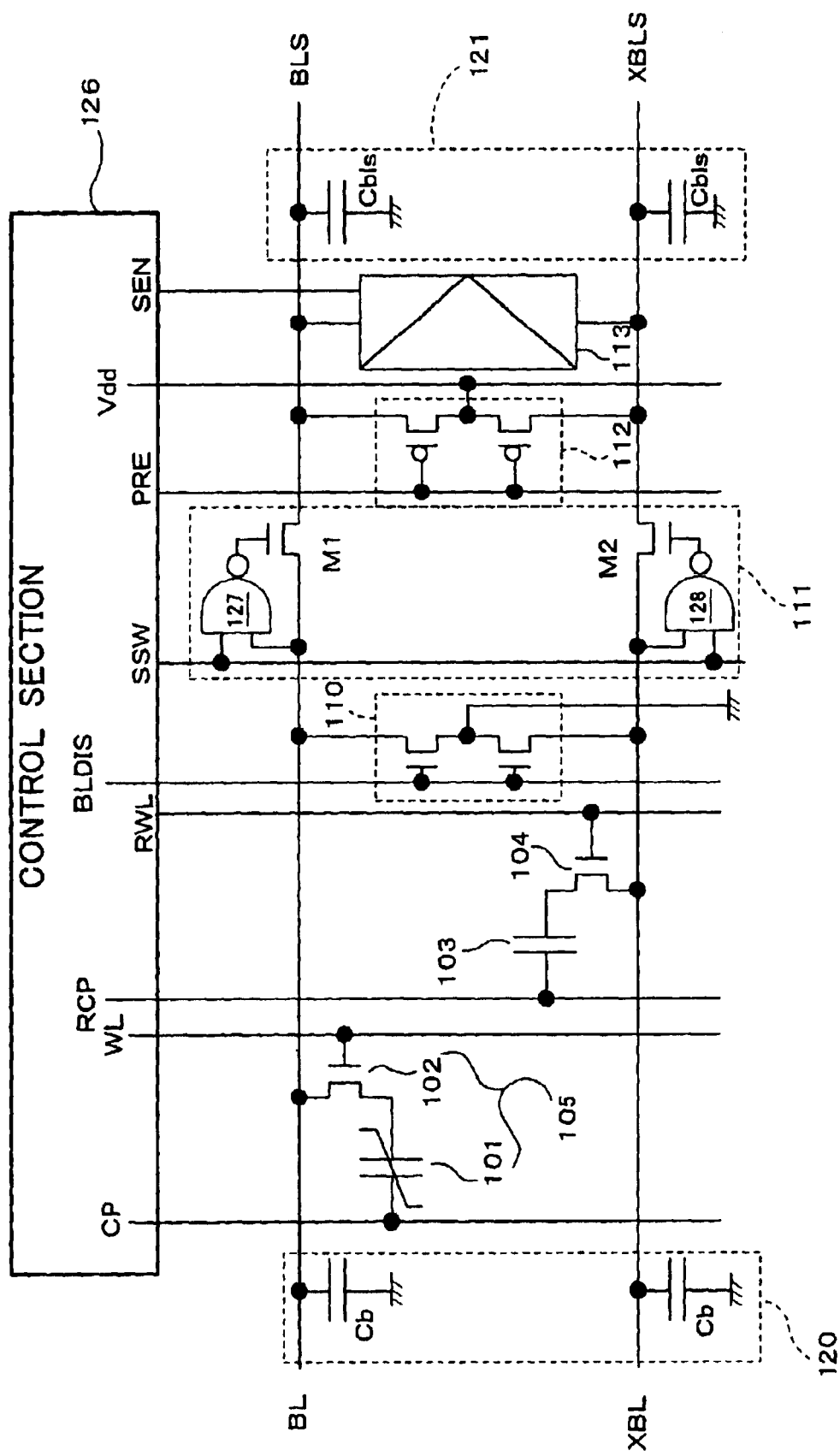
FIG. 8 is a structural diagram showing a ferroelectric storage device according to (Embodiment 4) of the present invention.

FIG. 8 shows a ferroelectric storage device according to (Embodiment 4) of the present invention. Those members having the same operations as those of (Embodiment 1) are indicated by the same reference numerals in the explanation below.

In (Embodiment 4), a transfer gate 111 is constituted by N-type transistors M1 and M2 and clamping circuits composed of NAND gates 127 and 128 of CMOS. The configuration of a control section 126 is identical to the control section 123 (Embodiment 1) except for a level of SSW.

A transistor 112 is controlled by a pre-charge control signal PRE and charges sub bit lines BLS and XBLS to a Vdd level.

The reading operation sequence is the same as that of (Embodiment 1) but is different from (Embodiment 1) in that the activating level of the SSW line is not a second potential (Vp2) but Vdd of a logic "H" level.

In the reading operation of (Embodiment 1), time for charging the bit lines is long in time t1 and time t2 of FIG. 2 because the transistors M1 and M2 of FIG. 1 are operated by a source follower. In contrast, in (Embodiment 4), bit lines are charged by the clamping circuits, each having bit line potential as input, thereby increasing the speed.

In the present embodiment, the clamping circuits are CMOS circuits of N-type MOS and P-type MOS. The formats of the clamping circuits are not limited and may be all NMOS circuits.

Further, as to (Embodiment 3) as well, the clamping circuit may be used instead of the transfer gate 111.

Embodiment 5

Figure 9:
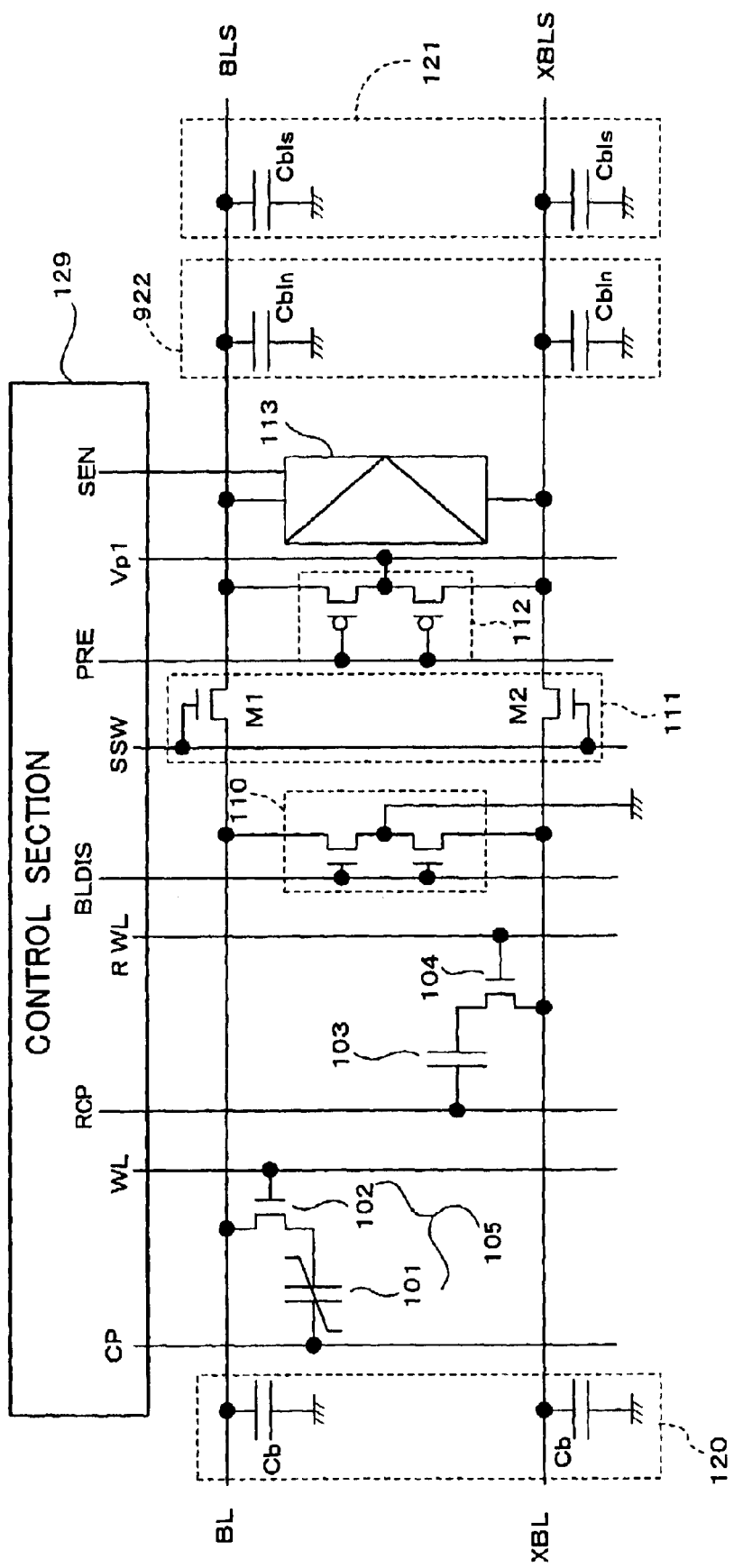
FIG. 9 is a structural diagram showing a ferroelectric storage device according to (Embodiment 5) of the present invention.

FIG. 9 shows a ferroelectric storage device according to (Embodiment 5) of the present invention. Those members having the same operations as those of (Embodiment 1) are indicated by the same reference numerals in the explanation below.

In FIG. 9, a bit line load capacitor 922 is added to (Embodiment 1) and is composed of a gate oxidation film capacitor of NMOS. The configuration of a control section 129 is identical to that of the control section 123 of (Embodiment 1).

In (Embodiment 1), the quantities of change in pit line potential in a reading operation are expressed by the equations below.

$$\Delta Vas = (Qa+dQa)/Cbls$$

$$\Delta Vbs = (Qb+dQb)/Cbls$$

When ΔVas and ΔVbs are larger than (Vp1−Vp2), it becomes difficult to perform desired amplification. Although any problems do not occur by sufficiently increasing a first potential (Vp1), the potential is limited due to restriction on a process. In contrast, in (Embodiment 5), the above problem can be solved by providing the sub bit lines with a capacitive load, and a change in potential of the bit line can be controlled as expressed by the equations below.

$$\Delta Vas = (Qa+dQa)/(Cbls+Cbln)$$

$$\Delta Vbs = (Qb+dQb)/(Cbls+Cbln)$$

And then, Cbln is preferably set so as to satisfy one of the following equations.

$$\Delta Vas < (Vp2-Vp1+\text{sense amplifier input sensitivity})$$

$$\Delta Vbs < (Vp2-Vp1+\text{sense amplifier input sensitivity})$$

Embodiment 6

Figure 10:
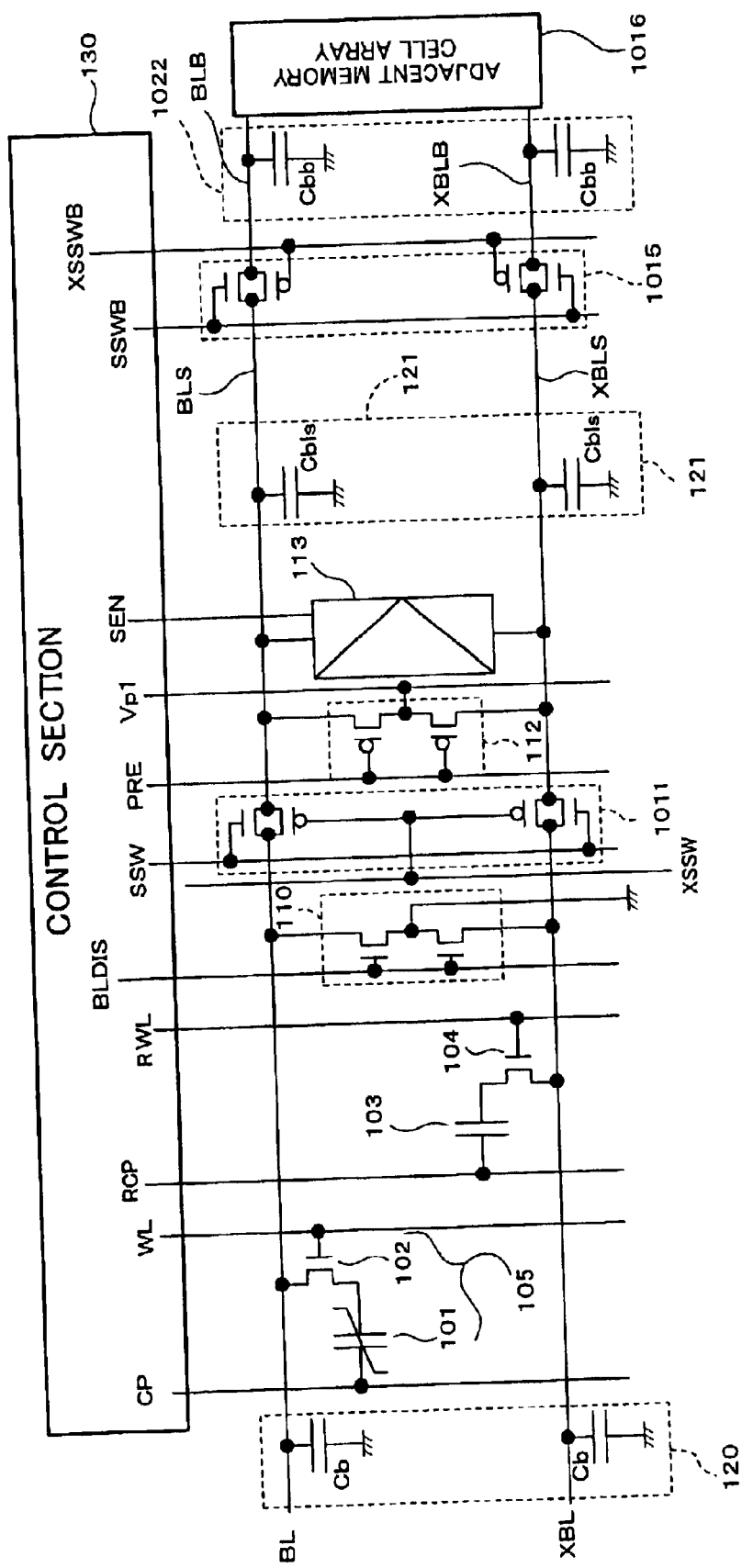
FIG. 10 is a structural diagram showing a ferroelectric storage device according to (Embodiment 6) of the present invention.

FIG. 10 shows a ferroelectric storage device according to (Embodiment 6) of the present invention. Those members having the same operations as those of (Embodiment 1) are indicated by the same reference numerals in the explanation below.

FIG. 10 is different from (Embodiment 1) in that the transfer gate 111 of FIG. 1 is replaced with a CMOS transfer gate 1011, and sub bit lines BLS and. XBLS are selectively connected to an adjacent memory cell array 1016 via a similar transfer gate 1015. The transfer gate 1015 is controlled by SSWB. A control section 130 is substantially identical in configuration to the control section 123 of (Embodiment 1), an XSSW line is always set at a third potential (Vp3), an SSWB line is always set at "L" level, an XSSWB line is set at "L" level from time t00 to time t3 and is set at the third potential (Vp3) in other times.

With this configuration, a parasitic bit line capacity 1022 of the adjacent memory cell array can be used instead of the bit line load capacity 922 required in (Embodiment 5), thereby reducing the area.

Embodiment 7

Figure 11:
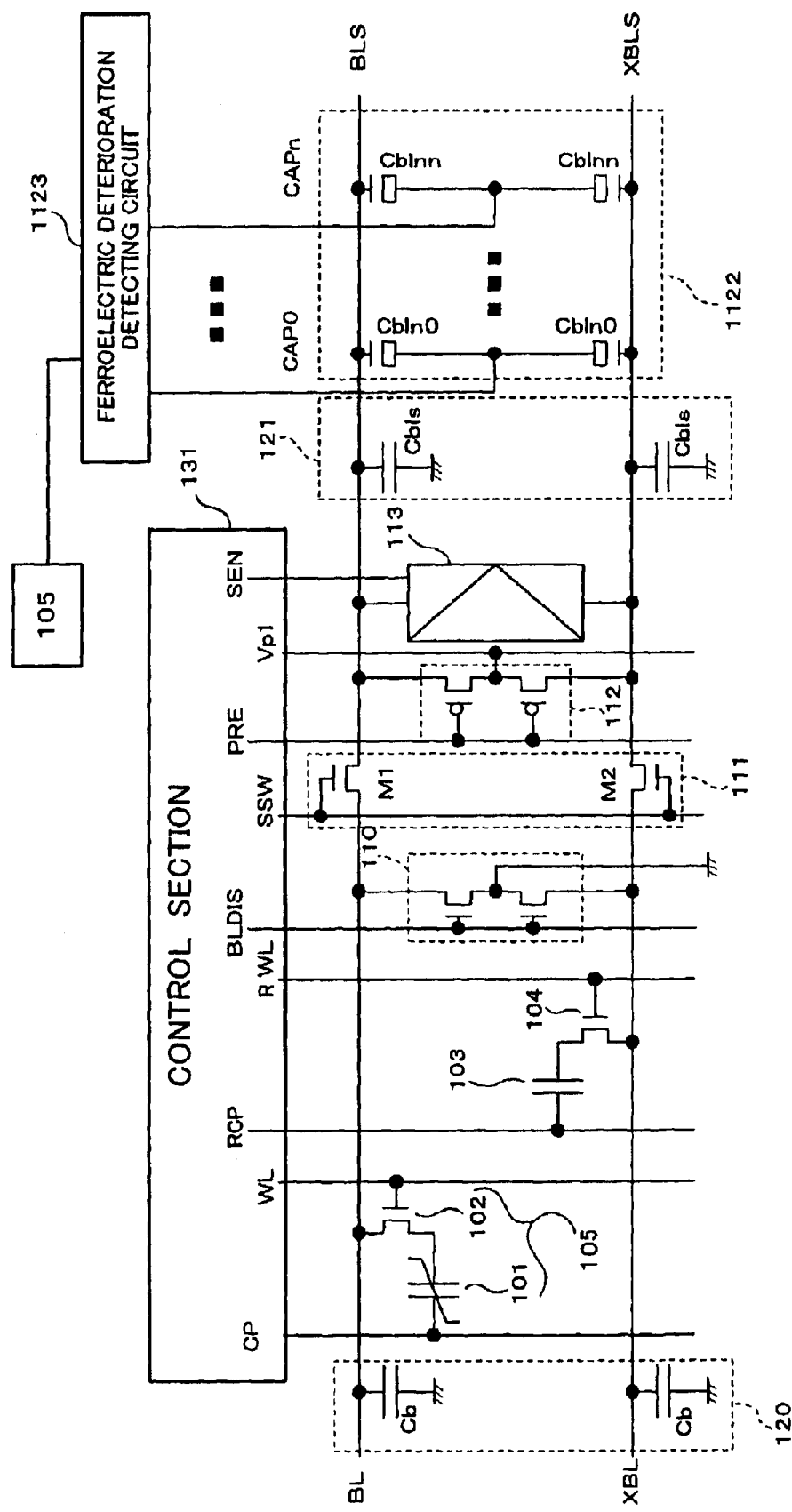
FIG. 11 is a structural diagram showing a ferroelectric storage device according to (Embodiment 7) of the present invention.

FIG. 11 shows a ferroelectric storage device according to (Embodiment 7) of the present invention. Those members having the same operations as those of (Embodiment 5) are indicated by the same reference numerals in the explanation below.

In FIG. 11, a sub bit line capacitive load 1122 composed of n capacities of Cbln0 to Cblnn is provided instead of the bit line capacitive load 922 of FIG. 9, and a ferroelectric deterioration detecting circuit 1123 is provided. The ferroelectric deterioration detecting circuit 1123 monitors a ferroelectric memory cell 105 other than a selected memory cell 105 to measure deterioration of the ferroelectric capacitor 101 (a degree of deterioration of Pr in FIG. 3). A control section 131 is identical in configuration to the control section 123 of (Embodiment 1).

In (Embodiment 5), capacitors are added to the sub bit lines for optimization of the reading operation. Since (Qa+dQa) and (Qb+dQb) are reduced by deterioration of the ferroelectric, a sub bit line capacitance which is optimally set in the initial state deviates, from an optimum value after deterioration of the ferroelectric. In order to solve the problem, the present embodiment is configured such that a sub bit line capacitors can be selectively applied in response to control signals CAP0 to CAPn. The signals CAP0 to CAPn are controlled by a ferroelectric deterioration judging circuit 1023, which is additionally provided, to always set a sub bit line capacitance at an optimum value.

Embodiment 8

Figure 12:
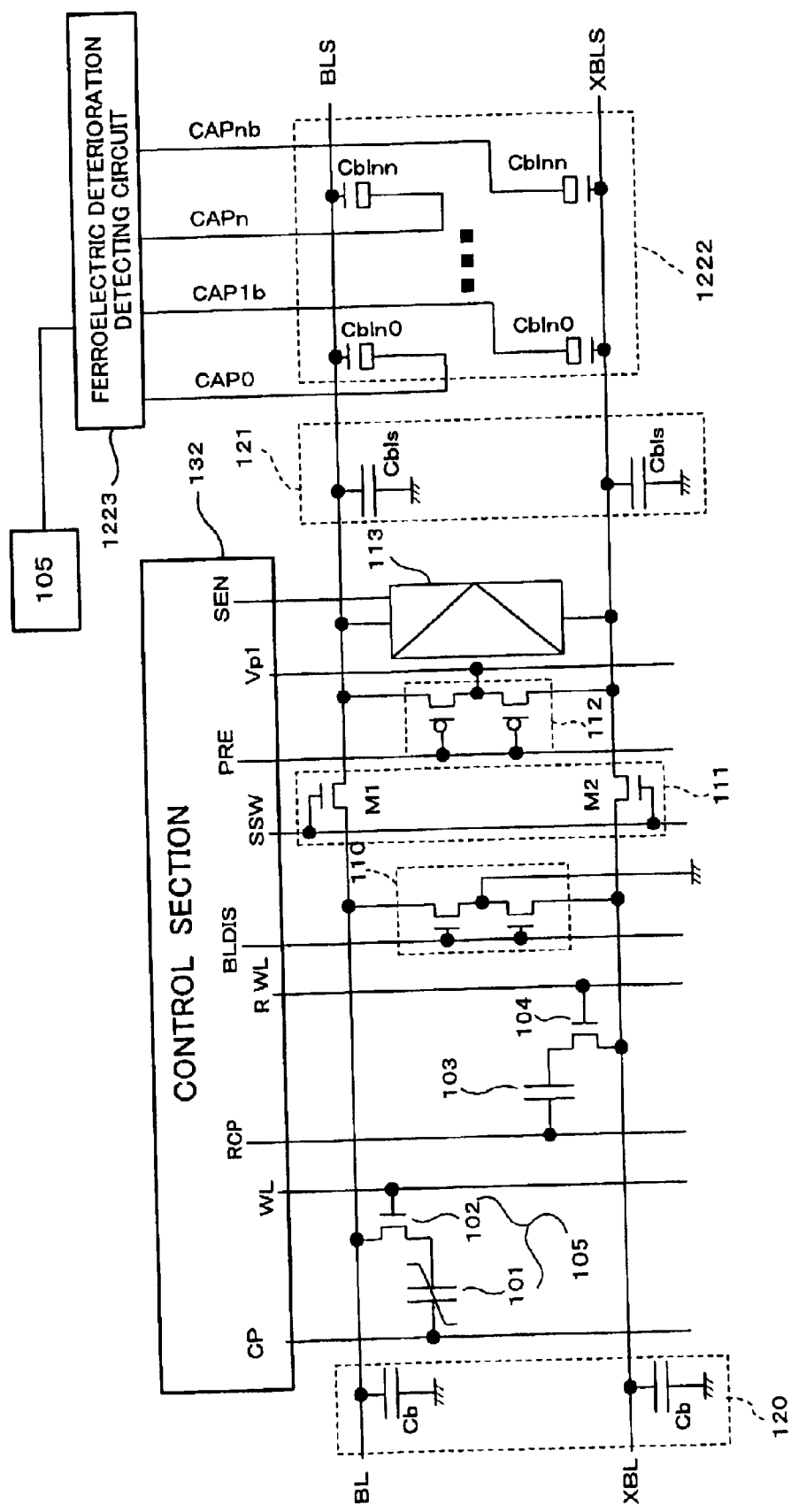
FIG. 12 is a structural diagram showing a ferroelectric storage device according to (Embodiment 8) of the present invention.

FIG. 12 shows a ferroelectric storage device according to (Embodiment 8) of the present invention. (Embodiment 8) is configured such that connections between the bit line capacitive loads and the sub bit lines BLS and XBLS of (Embodiment 7) are separately controlled. A control section 132 is identical in configuration to the control section 131 of (Embodiment 1).

Reference numerals CAP0 to CAPn denote capacitive load control lines for a sub bit line BLS, and reference numerals CAP0b to CAPnb denote capacitive load control lines for a sub bit line XBLS. A ferroelectric deterioration detecting circuit 1223 of (Embodiment 8) is configured so as to set CAPn and CAPnb when deterioration of the ferroelectric is detected and screening is carried out.

During a test and so on of the ferroelectric storage device, when screening is carried out on a ferroelectric capacitor with a small reading margin, it is possible to add an offset to a reading potential by separately controlling CAP0 to CAPn and CAP0b to CAPnb, thereby detecting a ferroelectric capacitor not reaching a desired operating margin.

The above explanation specifically discussed the embodiments of the present invention. However, the present invention is not limited to the above embodiments. For example, although the ferroelectric storage device with a 1T1C configuration was discussed in the above example, the present invention is applicable to a ferroelectric storage device with a 2T2C configuration. In that case, the reference capacitor is replaced with a ferroelectric capacitor, complementary data is written in the two ferroelectric capacitors, the RWL line is commonly used with the word line WL, and RCP is commonly used with the cell plate line CP.

As described above, according to the present invention, the maximum polarization charge stored in writing can be retrieved in the reading operation, thereby remarkably increasing a margin of the reading operation. Additionally, the operation can be performed with stability even at a low voltage.

What is claimed is:

1. A ferroelectric storage device, comprising:
   (a) a ferroelectric memory cell comprising a selection transistor and a ferroelectric capacitor, said selection transistor having a drain or a source connected to one terminal of said ferroelectric capacitor;
   (b) a word line connected to a gate of said selection transistor;
   (c) a bit line connected to a source or a drain of said selection transistor, said source or drain not being connected to said ferroelectric capacitor; and
   (d) reading means having a bit line charge circuit for charging said bit line to a predetermined voltage while said word line is activated, said reading means detecting a quantity of charge used by said bit charge circuit in charging said bit line to said predetermined potential to read out data stored in said ferroelectric memory cell, said reading means further comprising
   (1) a sub bit line connected to said bit line charge circuit so as to supply charge for charging said bit line;
   (2) a sub bit line charge circuit for pre-charging said sub bit line to a first potential;
   (3) a sense amplifier for amplifying voltage of said sub bit line after said bit line is charged via said bit line charge circuit; and
   (4) a second bit line charge circuit, wherein said reading means activates said sub bit line charge circuit, pre-charges said sub bit line to said first potential and pre-charges said bit line to a second potential by activating said second bit line charge circuit, inactivates said sub bit line charge circuit and said second bit line charge circuit, activates said bit line charge circuit, and activates said sense amplifier to amplify voltage of said sub bit line after said word line is activated and a memory cell for reading is selected to perform a reading operation.

2. A ferroelectric storage device, comprising:
   (a) a ferroelectric memory cell comprising a selection transistor and a ferroelectric capacitor, said selection transistor having a drain or a source connected to one terminal of said ferroelectric capacitor;
   (b) a word line connected to a gate of said selection transistor;
   (c) a bit line connected to a source or a drain of said selection transistor, said source or drain not being connected to said ferroelectric capacitor; and
   (d) reading means having a bit line charge circuit for charging said bit line to a predetermined voltage while said word line is activated, said reading means detecting a quantity of charge used by said bit charge circuit in charging said bit line to said predetermined potential to read out data stored in said ferroelectric memory cell, said reading means further comprising
   (1) a sub bit line connected to said bit line charge circuit so as to supply charge for charging said bit line;
   (2) a sub bit line charge circuit for pre-charging said sub bit line to a first potential;
   (3) a sense amplifier for amplifying voltage of said sub bit line after said bit line is charged via said bit line charge circuit; and
   (4) a second bit line charge circuit, wherein said reading means pre-charges a potential of said sub bit line to said first potential in advance, pre-charges said bit line to a second potential by activating said second bit line charge circuit, inactivates said sub bit line charge circuit and said second bit line charge circuit, activates said bit line charge circuit, and activates said sense amplifier to amplify voltage of said sub bit line after said word line is activated and a memory cell for reading is selected to perform a reading operation.

3. A ferroelectric storage device, comprising:
   (a) a ferroelectric memory cell comprising a selection transistor and a ferroelectric capacitor, said selection transistor having a drain or a source connected to one terminal of said ferroelectric capacitor;
   (b) a word line connected to a gate of said selection transistor;
   (c) a bit line connected to a source or a drain of said selection transistor, said source or drain not being connected to said ferroelectric capacitor; and
   (d) reading means having a bit line charge circuit for charging said bit line to a predetermined voltage while said word line is activated, said reading means detecting a quantity of charge used by said bit charge circuit in charging said bit line to said predetermined potential to read out data stored in said ferroelectric memory cell, said reading means further comprising
   (1) a sub bit line connected to said bit line charge circuit so as to supply charge for charging said bit line, and further comprising a sub bit load capacitor;
   (2) a sub bit line charge circuit for pre-charging said sub bit line to a first potential;
   (3) a sense amplifier for amplifying voltage of said sub bit line after said bit line is charged via said bit line charge circuit; and
   (4) a ferroelectric deterioration detecting circuit having a plurality of the sub bit line load capacitors, said ferroelectric deterioration detecting circuit detecting deterioration of a ferroelectric and controlling a capacitance connected to said sub bit line.

4. The ferroelectric storage device according to claim 3, wherein said reading means is selectively configured such that sub bit line load capacitances connected to a selection sub bit line and a reference sub bit line are different.

* * * * *